(12) United States Patent
Verbeke et al.

(10) Patent No.: US 12,266,378 B2
(45) Date of Patent: Apr. 1, 2025

(54) SOUND MODIFICATION BASED ON FREQUENCY COMPOSITION

(71) Applicant: HARMAN INTERNATIONAL INDUSTRIES, INCORPORATED, Stamford, CT (US)

(72) Inventors: Joseph Verbeke, San Francisco, CA (US); Stefan Marti, Oakland, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 445 days.

(21) Appl. No.: 17/615,691

(22) PCT Filed: Jun. 5, 2019

(86) PCT No.: PCT/IB2019/054648
§ 371 (c)(1),
(2) Date: Dec. 1, 2021

(87) PCT Pub. No.: WO2020/245631
PCT Pub. Date: Dec. 10, 2020

(65) Prior Publication Data
US 2022/0246161 A1 Aug. 4, 2022

(51) Int. Cl.
*G10L 21/034* (2013.01)
*G06F 3/04847* (2022.01)
(Continued)

(52) U.S. Cl.
CPC ........ *G10L 21/034* (2013.01); *G06F 3/04847* (2013.01); *G06F 3/165* (2013.01);
(Continued)

(58) Field of Classification Search
CPC ....... G10L 21/034; G10L 25/18; G10L 25/51; G10L 21/00; G10L 21/0316;
(Continued)

(56) References Cited

U.S. PATENT DOCUMENTS 7,590,543 B2 * 9/2009 Kjorling ............ H03H 17/0266
704/229
9,609,383 B1 * 3/2017 Hirst ........................ H04S 7/30
(Continued)

FOREIGN PATENT DOCUMENTS

CN 105679302 A 6/2016

OTHER PUBLICATIONS

International Search Report and Written Opinion, PCT/IB2019/054648, Mar. 4, 2020, 13 pages.

*Primary Examiner* — Oyesola C Ojo
(74) *Attorney, Agent, or Firm* — Artegis Law Group, LLP

(57) ABSTRACT

In various embodiments, a sound modification application selectively modifies one or more sounds included in one or more audio signals. In operation, the sound modification application determines classifications associated with multiple sounds included in one or more audio signals. The sound modification application selects a first frequency sub-band of a first sound included in the multiple sounds based on a first classification associated with the first sound. The sound modification application then modifies the first frequency sub-band of the first sound, without modifying at least a second frequency sub-band of the first sound, to generate a modified audio signal.

17 Claims, 6 Drawing Sheets

(51) Int. Cl.
*G06F 3/16* (2006.01)
*G10L 25/18* (2013.01)
*G10L 25/51* (2013.01)
*H03F 3/183* (2006.01)

(52) U.S. Cl.
CPC .............. *G10L 25/18* (2013.01); *G10L 25/51* (2013.01); *H03F 3/183* (2013.01); *H03F 2200/03* (2013.01)

(58) Field of Classification Search
CPC ...... G06F 3/04847; G06F 3/165; H03F 3/183; H03F 2200/03; G11B 27/031; H03G 5/025; H03G 5/165
See application file for complete search history.

(56) References Cited

U.S. PATENT DOCUMENTS

| | | | |
|---|---|---|---|
| 10,014,002 B2 * | 7/2018 | Koretzky | G10L 25/30 |
| 11,373,672 B2 * | 6/2022 | Mesgarani | G10L 25/30 |
| 11,606,663 B2 * | 3/2023 | Vetter | G06F 3/165 |
| 2013/0097510 A1 * | 4/2013 | Maling, III | H04L 12/282 |
| | | | 715/727 |
| 2016/0165336 A1 * | 6/2016 | Di Censo | H04S 7/304 |
| | | | 381/80 |
| 2017/0316792 A1 * | 11/2017 | Chaudhuri | G10L 19/022 |
| 2017/0374478 A1 * | 12/2017 | Jones | G10L 21/0364 |
| 2018/0122403 A1 * | 5/2018 | Koretzky | G10L 21/028 |
| 2020/0329322 A1 * | 10/2020 | Ramsay | H04R 29/00 |

* cited by examiner

SOUND MODIFICATION BASED ON FREQUENCY COMPOSITION

This application is a U.S. National Stage patent application of International Patent Application No. PCT/IB2019/054648, filed Jun. 5, 2019, the benefit of which is claimed. The subject matter of this related application is hereby incorporated herein by reference.

BACKGROUND

Field of the Various Embodiments

The various embodiments relate generally to audio processing, and more specifically, to sound modification based on frequency composition.

Description of the Related Art

Augmented reality is a growing area of interest in which a real world environment may be augmented by computer-generated or computer-manipulated content. The computer-manipulated content may include an audio signal that has been modified from an original audio signal captured by an audio input device.

An audio signal captured by an audio input device for augmented reality processing may include multiple sounds. The multiple sounds may be produced by multiple sources (e.g., people, animals, objects) in an environment. Audio processing of the original audio signal may include selectively modifying the audio signal to emphasize or deemphasize certain sounds, thereby augmenting the auditory reality that a user may perceive.

Conventional approaches for selectively modifying sounds include selectively increasing or decreasing the energy level of certain sounds. For example, an inverse sound wave may be generated to cancel a certain sound within an audio signal. As another example, in order to enhance a certain sound, the amplitude of a sound channel corresponding to that sound may be increased.

One drawback of these conventional approaches is that other sounds in the audio signal may be unintentionally affected by the modification. For example, the inverse sound wave described above may unintentionally cancel all or part of other sounds included in the audio signal. Another drawback is that the overall energy level of the audio signal may be significantly altered by the modification. As a result, the modified audio signal, when output, may be perceived by a user as being too loud or too soft, making listening to the sounds in the modified audio signal jarring and/or unpleasant.

As the foregoing illustrates, what is needed are more effective techniques for sound modification.

SUMMARY

One embodiment sets forth a method for modifying a sound included in an audio signal. The method includes determining, for each sound included in a plurality of sounds included in an audio signal, one or more classifications associated with the sound; selecting a first frequency sub-band of a first sound included in the plurality of sounds based on a first classification associated with the first sound; and modifying the first frequency sub-band of the first sound, without modifying at least a second frequency sub-band of the first sound, to generate a modified audio signal.

Further embodiments provide, among other things, a system and one or more computer-readable storage media configured to implement the method set forth above.

At least one advantage and technological improvement of the disclosed techniques is that one or more sounds included in an audio signal can be modified without significantly altering the overall energy level of the audio signal. Accordingly, the modified audio signal may sound more natural and properly balanced to a user, as compared to an audio signal that is modified using conventional approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Embodiments disclosed herein include a sound modification system that includes one or more audio input devices arranged to acquire one or more audio signals and one or more audio output devices. The sound modification system further includes a processing unit coupled with the audio input devices and audio output devices, wherein the processing unit operates to selectively modify one or more sounds included in the one or more audio signals, and to output one or more modified audio signals via the one or more audio output devices. Sounds included in the one or more audio signals may be selected for modification based on user input. In various embodiments, a sound included in the one or more audio signals is modified by modifying a frequency sub-band of the sound. A frequency sub-band may be selected for modification based on one or more classifications associated with the sound.

The sound modification system may be implemented in various forms of audio-based systems, such as personal headphones or other wearable audio devices, home audio systems, vehicle audio systems, etc. The sound modification system may also be implemented in various forms of audio-capable systems, such as smartphones, tablet computers, desktop computers, laptop computers, etc. The sound modification system may determine multiple sounds included in an audio signal and selectively modify one or more sounds included in the multiple sounds. The sound modification system may perform its processing functions using a dedicated processing device and/or a separate computing device such as a user's mobile computing device or a cloud computing system.

Figure 1:
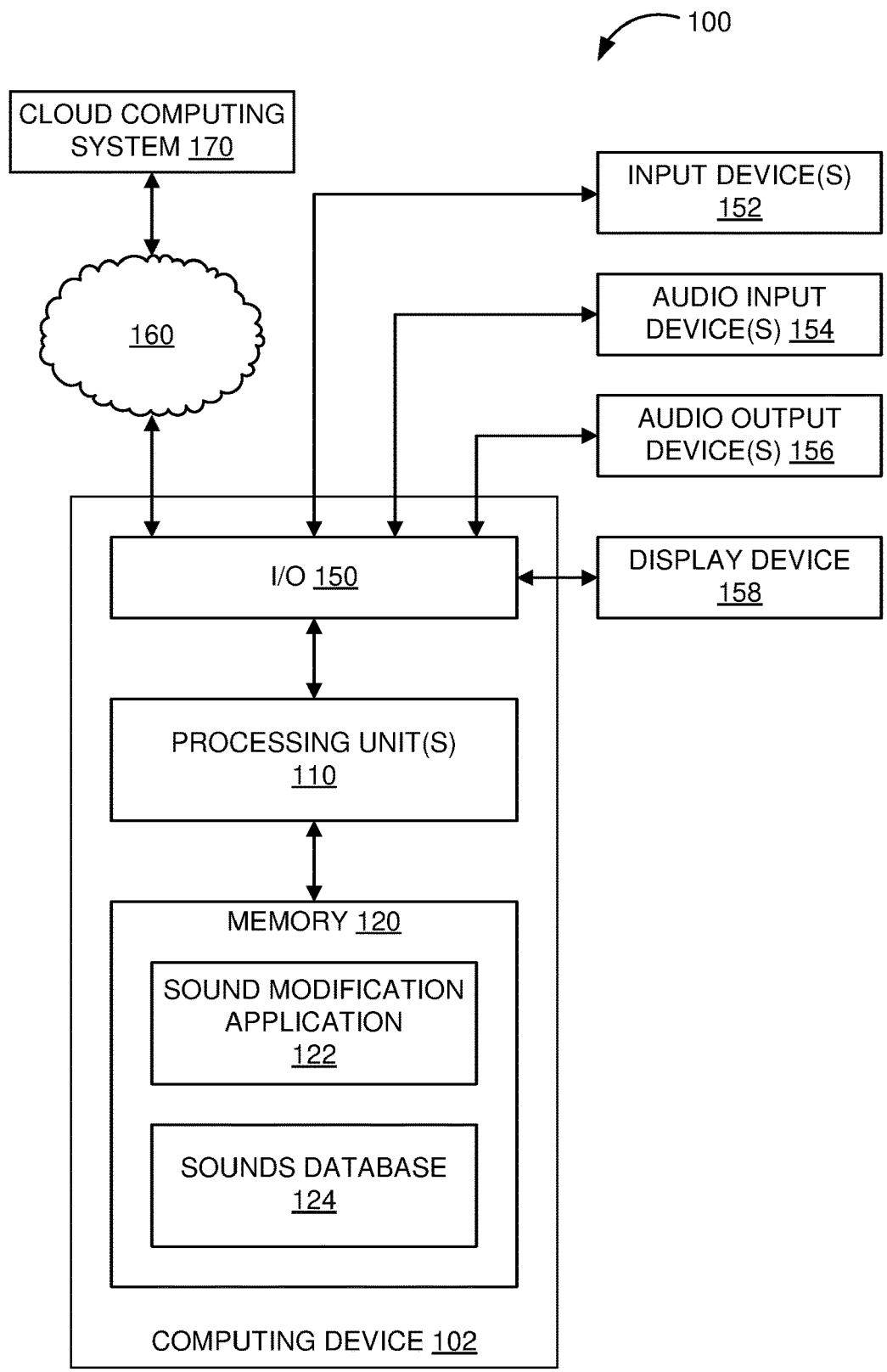
FIG. 1 illustrates a sound modification system configured to implement one or more aspects of the various embodiments.

FIG. 1 illustrates a sound modification system 100 configured to implement one or more aspects of the various embodiments. As shown, sound modification system 100 includes a computing device 102, input device(s) 152, audio input device(s) 154, and audio output device(s) 156. The computing device 102 includes one or more processing units 110, memory 120, and input/output (I/O) 150. The sound modification system 100 may further include a display device 158.

The processing unit(s) 110 may include any processing element capable of performing the functions described herein. While depicted as a single element within the computing device 102, processing unit(s) 110 is intended to represent a single processor, multiple processors, a processor or processors having multiple cores, as well as combinations thereof. The processing unit 110 may be any suitable processor, such as a central processing unit (CPU), a graphics processing unit (GPU), an application-specific integrated circuit (ASIC), a field programmable gate array (FPGA), a digital signal processor (DSP), any other type of processing unit, or a combination of different processing units, such as a CPU configured to operate in conjunction with a DSP. In general, processing unit 110 may be any technically feasible hardware unit capable of processing data and/or executing software applications or modules, including sound modification application 122.

Memory 120 may include a variety of computer readable media selected for their size, relative performance, or other capabilities: volatile and/or non-volatile media, removable and/or non-removable media, etc. Memory 120 may include cache, random access memory (RAM), storage, etc. Of course, various memory chips, memory bandwidths, and memory form factors may alternately be selected. Storage included as part of memory 120 may typically provide a non-volatile memory for the computing device 102, and may include one or more different storage elements such as flash memory, a hard disk drive, a solid state drive, an optical storage device, and/or a magnetic storage device.

Memory 120 may include one or more applications or modules for performing the functions described herein. In various embodiments, any of the modules and/or applications included in memory 120 may be implemented locally by the sound modification system 100 and/or may be implemented via a cloud-based architecture. For example, any of the modules and/or applications included in memory 120 may be executed on a remote device (e.g., a server system, a cloud computing platform, etc.) that communicates with sound modification system 100 via I/O 130 or network 160.

As shown, memory 120 includes a sound modification application 122 for determining one or more sounds included in an audio signal and selectively modifying the sounds in the audio signal. In various embodiments, the sound modification application 122 selects certain sounds included an audio signal, selects certain frequency sub-bands included in the selected sounds, and modifies the selected sub-bands. Memory 120 further includes a sounds database 124 that stores information regarding sounds, including information on sound classifications and associated frequency ranges.

The processing unit 110 may communicate with other devices, such as peripheral devices or other networked computing devices, using input/output (I/O) 150. I/O 150 may include any number of different I/O adapters or interfaces used to provide the functions described herein. I/O 150 may include wired and/or wireless connections, and may use various formats or protocols (e.g., Bluetooth® (a registered trademark of the Bluetooth Special Interest Group), Wi-Fi® (a registered trademark of the Wi-Fi Alliance), Universal Serial Bus (USB), etc.).

I/O 150 may also include one or more network interfaces that couple the processing unit 110 to one or more networked computing devices through a network 160. Examples of networked computing devices include a cloud computing system 170, a server system, a desktop computer, a mobile computing device such as a smartphone or tablet computer, and a worn device such as a watch or headphones or a head-mounted display device. Of course, other types of computing devices may also be networked with processing unit 110. Network 160 may include one or more networks of various types, including a local area or local access network (LAN), a general wide area network (WAN), and/or a public network (e.g., the Internet). In some embodiments, the networked computing devices may be used as additional processing units 110, additional memory 120, input devices 152, audio input devices 154, and/or audio output devices 156.

Input devices 152 are coupled with the processing device 110 and provide various inputs to the processing device 110. In some embodiments, input devices 152 may include a user interface to receive user inputs, such as user selections of certain sounds that have been determined to be included in an audio signal and user adjustments of energy levels of the certain sounds. The user interface may take any feasible form for providing the functions described herein, such as one or more buttons, toggles, sliders, dials, knobs, touch-sensitive surfaces, etc., and/or as a graphical user interface (GUI). The GUI may be provided through an optional display device 158. In some embodiments, the GUI may include a user interface object (e.g., a slider control) for each sound determined for an audio signal, where the slider control is associated with an energy level (e.g., amplitude, perceived loudness) of the sound.

Audio input devices 154 include one or more devices that capture sound waves occurring in the environment and generate an audio signal from the captured sound waves. The audio input device 154 may include one or more microphones (e.g., an omnidirectional microphone, a microphone array) and/or one or more other transducers or sensors capable of converting sound waves into an electrical audio signal. The audio input devices 154 may include an array of sensors that includes sensors of a single type, or a variety of different sensor types. Audio input devices 154 may be worn by a user or disposed separately at a fixed location or movable. The audio input devices 154 may be disposed in any feasible manner in the environment. Additionally or alternatively, audio input devices 154 may include one or more devices or systems that may provide audio signals to sound modification system 100 from recorded media (e.g., a media playback device, a media storage device). Additionally or alternatively, audio input devices 154 may include one or more intermediary devices (e.g., an amplifier, a sound mixer) that may transmit audio signals to sound modification system 100 from other audio input devices 154.

Audio output devices 156 are included to output audio signals. The audio output devices 156 may use any technically feasible audio output techniques, such as loudspeakers or other suitable electroacoustic devices. Audio output devices 156 may be implemented using any number of form factors, such as discrete loudspeaker devices, on-device speakers, around-the-ear (circumaural), on-ear (supraaural), or in-ear headphones, hearing aids, wired or wireless headsets, body-worn (e.g., head, shoulder, arm, etc.) listening devices, body-worn close-range directional speakers or speaker arrays, body-worn ultrasonic speaker arrays, and so forth. The audio output devices 156 may be worn by a user, or disposed separately at a fixed location or movable.

It should be appreciated that various embodiments of the sound modification system 100 may have different configurations of the various components shown in FIG. 1. For example, in one embodiment, the computing device 102, the input devices 152, the audio input device 154, the audio output device 156, and optionally the display device 158, may be included in one device, such as a smartphone, a tablet computer, a user-wearable headset, headphones, and so forth. In another embodiment, the audio input devices 154 and the audio output devices 156 may be separate from the computing device 102. For example, the audio input devices 154 and audio output devices 156 may be included in headphones that are connected to a separate computing device 102 (e.g., a smartphone, a laptop computer, etc.) via a wired or wireless connection.

In operation, the sound modification application 122 acquires one or more audio signals (e.g., via audio input devices 154) and performs various operations on the one or more audio signals. In various embodiments, the sound modification application 122 may determine a plurality of sounds included in the one or more audio signals, thereby detecting and/or identifying sounds produced by different sources that are included in the one or more audio signals. The determination may include determining, for each detected sound, the corresponding audio channel, stream, and/or signal. The sound modification application 122 may use any technically feasible technique to determine the plurality of sounds (e.g., sound spatialization, sound segmentation, sound object detection, sound decomposition, machine learning, etc.). In some embodiments, the functionality of determining the plurality of sounds may be performed by another module or application in memory 120 separate from the sound modification application 122. It should be appreciated that, while the embodiments described herein are, for ease of understanding, described with respect to one audio signal and sounds included in the audio signal, the described embodiments are also applicable to multiple audio signals and sounds included in the multiple audio signals. For example, the sound modification application 122 may acquire multiple audio signals (e.g., from multiple microphones and/or from a multi-channel playback device) and determine a plurality of sounds included in the multiple audio signals. In some embodiments, each audio signal may correspond to a different audio channel, each of which includes a different sound.

The sound modification application 122 may further determine one or more classifications for each of the determined sounds included in the one or more audio signals. The classifications associated with a sound may indicate the type of source that produced the sound. For example, possible sound classifications include types of persons (e.g., male, female), types of animals (e.g., dog, cat, bird), and types of objects (e.g., vehicle, construction equipment). The sound modification application 122 may use any technically feasible technique to determine one or more classifications associated with a sound (e.g., machine learning, etc.). The possible classifications may include classifications of one level of granularity or different levels of granularity. For example, at a lower, less detailed level of granularity, the classifications may include, for example, "people," "animals," and "objects." At a higher, more detailed level of granularity, the classifications may include more specific classifications (e.g., "male voice," "female voice," "dog," "cat," "bird," "car," "traffic," "airplane," "construction equipment," etc.).

In some embodiments, the determination of sounds in the one or more audio signals and the determination of classifications for the sounds may be performed together. For example, the processing of the audio signal for detecting and determining sounds in the one or more audio signals, described above, may further include processing that identifies the sources of the sounds and determining the classification(s) associated with the sounds based on the identifying. In some embodiments, the functionality of determining the classifications of the sounds may be performed by another module or application in memory 120 separate from the sound modification application 122 (e.g., in the same module or application as the one performing the functionality of determining the sounds, as described above).

The sound modification application 122 may receive a user input that selects a sound included in the one or more audio signals for modification. In some embodiments, the sound modification application 122 presents a user interface (e.g., a GUI, audio prompts) that enables and/or prompts the user to adjust the desired energy levels for certain sounds. For example, a GUI displayed by the sound modification application 122 on the display device 158 may include a slider or other control (e.g., a dial, knob) for adjusting a level of each sound determined to be included in the one or more audio signals. The slider control may be associated with an energy level (e.g., an energy level relative to the original energy level in the audio signal) for the sound. The user may move a slider for a sound, via an input device 152, to select that sound for modification and to indicate a direction and an approximate amount of modification to that sound. The user may move sliders for one or more sounds to select the sounds for modification and to indicate directions and amounts of modification to the selected sounds.

The sound modification application 122, in response to receiving the user input selecting a sound for modification, may determine a frequency sub-band for modification in the selected sound. In some embodiments, the sound modification application 122 determines the frequency sub-band based on at least a classification associated with the sound. In particular, the sound modification application 122 may determine one or more characteristic frequency sub-bands for the sound based on the classification(s) of the sound. In some embodiments, a characteristic frequency sub-band of a sound classification indicates is a frequency range that is representative of, and contributes to the clarity of, sounds associated with the classification. For example, if the sound is classified as a female voice, the sound modification application 122 may identify one or more frequency sub-bands that are characteristic for female voices and select one or more of these sub-bands for modification. Further, in various embodiments, a characteristic frequency sub-band of a sound may be a frequency sub-band that is typical for the sound and/or contributes significantly to the discernment, isolation, and/or perceived loudness of the sound by users. For example, the characteristic frequency sub-band of a musical instrument sound may be important for users being able to hear the musical instrument amongst multiple sounds. As another example, amplifying the characteristic frequency sub-band of the musical instrument sound may amplify the perceived loudness of the sound. As a further example, modifying a frequency sub-band of a musical instrument sound outside of the characteristic frequency sub-band for the sound may cause the sound to be perceived as unnatural or untypical for the musical instrument.

In some embodiments, the sound modification application 122 may identify the characteristic frequency sub-bands for a classification by reference to information stored in sounds database 124. For example, the sound modification application 122 may acquire information indicating the characteristic frequency sub-bands from a sounds database 124. The sound modification application 122 then may modify the sound within the audio signal at the selected frequency sub-bands and generate an output audio signal that includes the modified sound, further details of which are described below.

In some embodiments, sounds database 124 includes a database of information regarding various classifications of sounds. For a given classification of sound, the sounds database 124 includes information on characteristic frequency sub-bands associated with that classification. Further, in some embodiments, the sounds database 124 may include references from one classification to one or more other classifications. For example, a higher level classification may reference or point to one or more lower level classifications (e.g., an animal sound classification may references classifications corresponding to specific types of animals), or vice versa. The information stored in sounds database 124 may be stored and queried via any technically feasible database storage and query technique. In some embodiments, the sounds database 124 may be located in a cloud computing system 170.

Figure 2A:
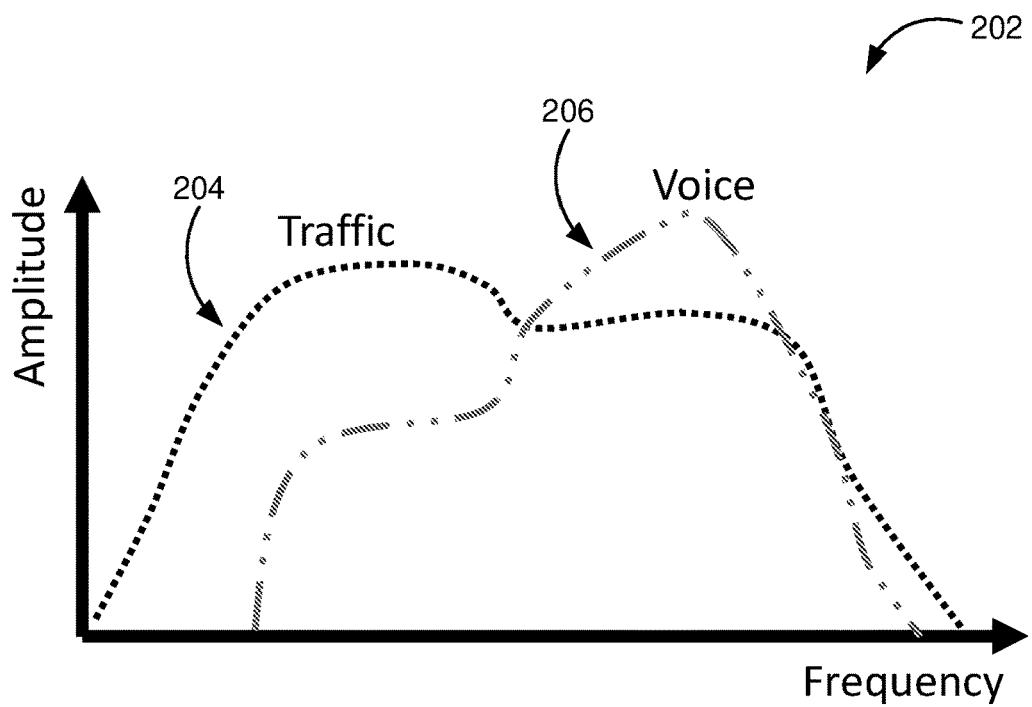
FIG. 2A illustrates a graphical representation of sounds included in an audio signal prior to modification, according to one or more aspects of the various embodiments.
Figure 2A:
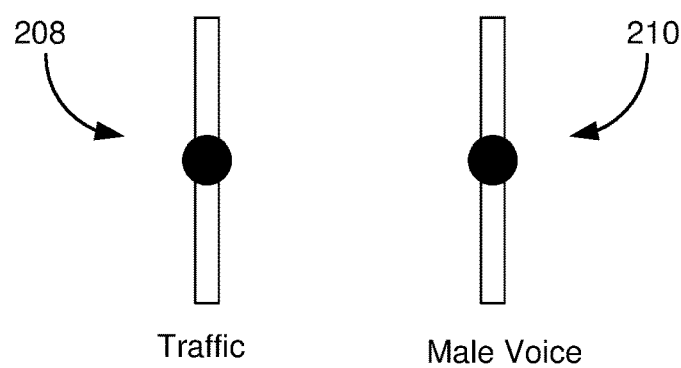

FIG. 2A illustrates a graphical representation 202 of sounds included in an audio signal prior to modification, according to one or more aspects of the various embodiments. As shown, the graphical representation 202 includes line graphs representing a first sound 204 and a second sound 206 that have been determined to be included in the original audio signal, plotted against frequency and amplitude axes. Sound 204 has been determined to be associated with a "traffic" sound classification, and sound 206 has been determined to be associated with a "male voice" sound classification. As can be seen from the representation 202, sounds 204 and 206 have different amplitudes at different frequency ranges.

FIG. 2A also illustrates slider controls 208 and 210 for the sounds 204 and 206, respectively. The sound modification application 122 may present (e.g., display in a GUI) the slider controls 208 and 210 for the two sounds 204 and 206, thereby enabling the user to select and adjust one or more of the sounds 204 and 206. As shown, the slider controls 208 and 210 may start at the middle position, where the middle position may represent the energy level of the corresponding sound in the original audio signal.

Figure 2B:
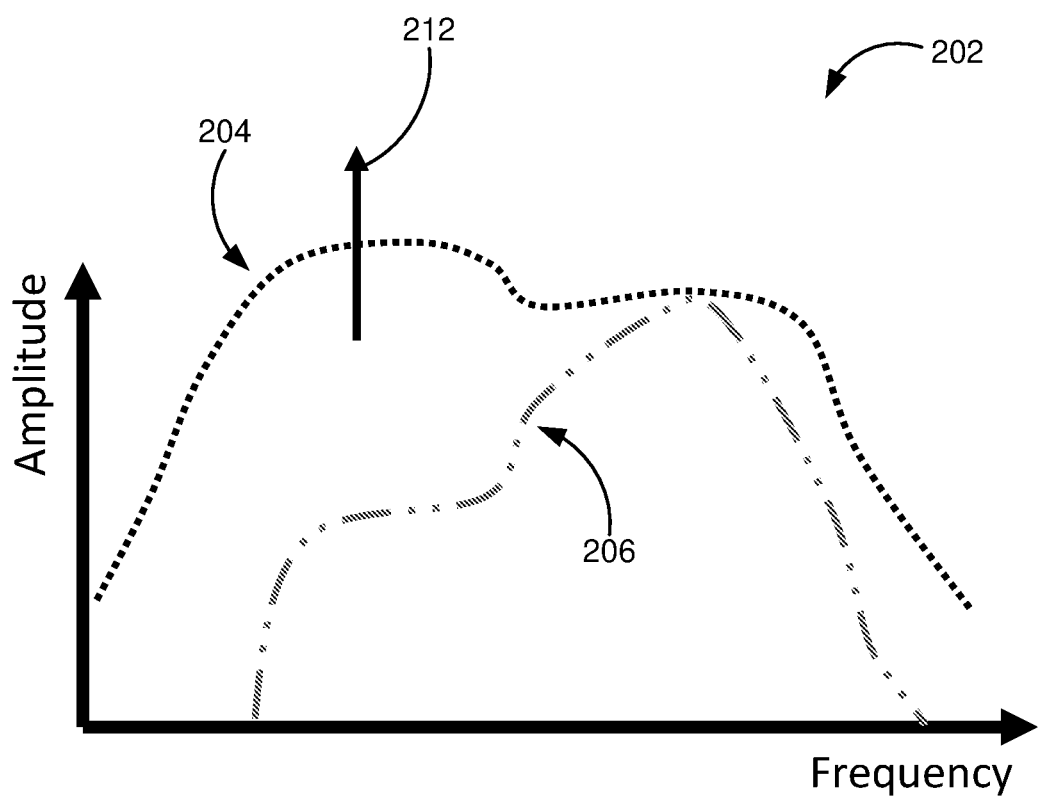
FIG. 2B illustrates modification of a sound included in the audio signal of FIG. 2A according to conventional techniques.

FIG. 2B illustrates modification of a sound included in the audio signal of FIG. 2A according to conventional techniques. If the user selects the traffic sound 204 for adjustment, then the traffic sound may be modified. For example, and as shown in FIG. 2B, the amplitude of the traffic sound 204 is increased by a certain amount across the entire frequency band of the traffic sound 204. However, modifying the amplitude across the entire frequency band of the sound has a drawback of increasing the overall energy level of the output audio signal, which the user may perceive as significantly increasing the loudness of the output audio signal. This increased loudness can make listening to the output audio signal unpleasant to the user.

Figure 2C:
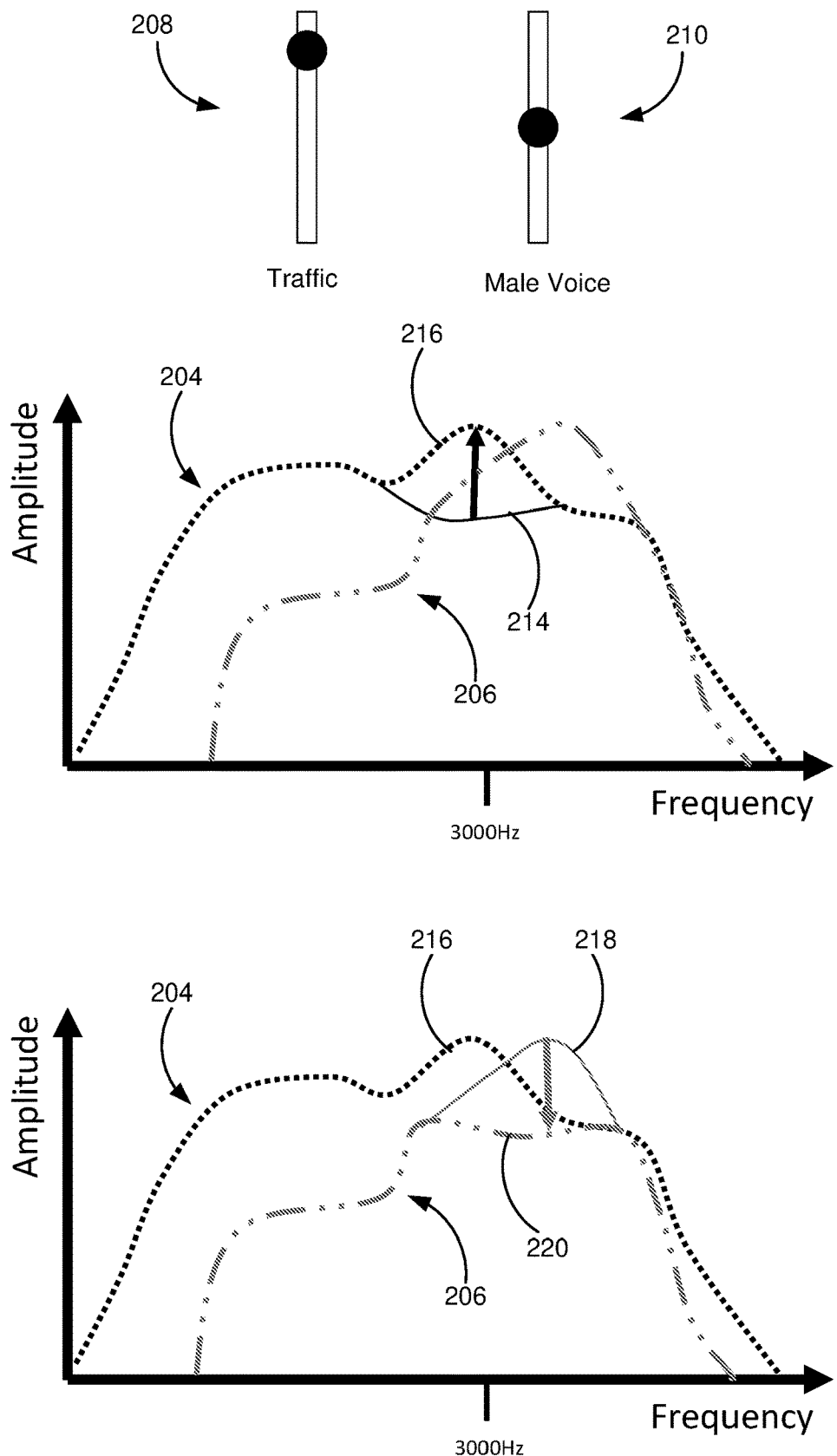
FIG. 2C illustrates modification of sounds in the audio signal of FIG. 2A, according to one or more aspects of the various embodiments.

FIG. 2C illustrates a modification of sounds included in the audio signal of FIG. 2A, according to one or more aspects of the various embodiments. As described above, the sound modification application 122 may present (e.g., display in a GUI) the slider controls 208 and 210 for sounds 204 and 206. The user may manipulate the traffic sound slider 208 to select the traffic sound 204 for modification and to indicate a direction and approximate amount of modification. For example, the traffic sound slider 208 is shown in FIG. 2C as having been moved upward compared to the slider 208 shown in FIG. 2A, indicating that the user wants the traffic sound 204 modified upward. For example, the traffic sound 204 may be modified upward in order to make the sound 204 more prominent and/or more audible compared to the other sounds. Additionally or alternatively, a sound may be modified downward in order to make the sound less prominent and/or less audible compared to other sounds. In response to the user selection, the sound modification application 122 increases the energy level (e.g., the amplitude) of one or more frequency sub-bands of the traffic sound 204.

In some embodiments, the sound modification application 122 obtains information indicating frequency sub-bands from the sounds database 124, where a frequency sub-band is a range of frequencies. Particularly with respect to sound 204, the sound modification application 122 obtains information regarding the "traffic" sound classification from the sounds database 124. Based on the obtained information, which may include information indicating characteristic frequency sub-bands for "traffic" sounds, the sound modification application 122 may select frequency sub-band amongst the characteristic sub-bands for modification. For example, if the obtained information indicates that sounds associated with the "traffic" classification have a characteristic sub-band in the 2500 Hz-3500 Hz range, then the sound modification application 122 may select a 2500 Hz-3500 Hz sub-band, or a narrower sub-band within the 2500 Hz-3500 Hz range, for modification. For example, in FIG. 2C, a range centered at approximately 3000 Hz has been selected for the traffic sound 204.

In some embodiments, the sound modification application 122 may analyze the selected sound in the one or more audio signals, and optionally also the other sounds in the one or more audio signals and/or the one or more audio signals as a whole. The sound modification application 122 may use the analysis to determine and/or adjust the frequency sub-band to be selected for modification, in conjunction with or in lieu of determining the sub-band based on information obtained from sounds database 124. In some embodiments, if an audio signal includes just one sound, the sound may be analyzed to determine a frequency sub-band, instead of using information from sounds database 124, in order to determine a frequency sub-band that is specific to the sound as included in the audio signal. The sound modification application 122 may analyze the sound 204 to determine and select one or more characteristic frequency sub-bands in the sound 204 using any technically feasible technique (e.g., sound spectrogram analysis). In some embodiments, the sound modification application 122 may first determine a frequency sub-band in sound 204 based on information from the sounds database 124 and then adjust the determined sub-band based on an analysis of the sound 204. The adjustment may include shifting the center of the sub-band and/or widening or narrowing the bandwidth of the sub-band.

After selecting the 3000 Hz sub-band for modification, the sound modification application 122 proceeds to modify the traffic sound 204 at the selected sub-band. In some embodiments, the sound modification application 122 modifies sounds using a parametric equalization technique. The sound modification application 122 obtains a center frequency and a bandwidth for the parametric equalization from the selected frequency sub-band, and determines a modification amount for the parametric equalization based on the slider control 208 as manipulated by the user. In some embodiments, the modification amount is a percentage of an upward or downward modification (e.g., percentage of increase or decrease of the amplitude) based on the position of the slider. In some other embodiments, the modification amount is an absolute amount of modification (e.g., a plus or minus amount of amplitude) based on the position of the slider. Accordingly, in FIG. 2C, the amplitude of a sub-band portion 214 of the traffic sound 204 is increased to the modified portion 216.

In some embodiments, the sound modification application 122 may also automatically modify one or more other sounds included in the one or more audio signals, in order to make the sound modified according to the user selection more prominent or less prominent. The automatic modification of the other sound(s) may occur without manual manipulation, by the user, of the slider(s) for the other sounds. For example, as shown in FIG. 2C, the male voice sound 206 may be modified to make the upward-modified traffic sound 204 even more prominent. Thus, a sub-band of the male voice sound 206 may be selected in a manner similar to that described above. Additionally, in some embodiments, the sub-band in the male voice sound 206 may be selected based on proximity to the modified sub-band portion 216 in traffic sound 204. For example, a portion 218 in the male voice sound 206 may correspond to a sub-band that is in proximity to the sub-band portion 216 in traffic sound 204 as well as being within a characteristic sub-band for the male voice sound 206. In some embodiments, a sub-band is in proximity to another sub-band if the center frequencies of the two sub-bands differ by less than a predefined amount and/or the two sub-bands overlap. In some other embodiments, the sound modification application 122 modifies just the sound(s) that have been affirmatively selected by the user for modification (e.g., the sounds for which the user has manipulated corresponding slider controls).

More generally, in various embodiments, the sound modification application 122 may make a sound more prominent or less prominent by any combination of: 1) modifying the sound across the entire frequency band of the sound (e.g., according to the techniques described above in conjunction with FIG. 2B); 2) modifying a frequency sub-band (e.g., the characteristic frequency sub-band) of the sound; and 3) modifying a frequency sub-band (e.g., the characteristic frequency sub-band) of one or more other sounds. For example, to make a first sound more prominent, the sound modification application 122 may simply amplify the first sound. As another example, the sound modification application 122 may amplify a certain frequency sub-band (e.g., the characteristic sub-band) of the first sound. As a further example, the sound modification application 122 may attenuate one or more frequency sub-bands (e.g., characteristic sub-bands) of one or more other sounds that perceptually compete with the first sound. As yet another example, the sound modification application 122 may modify one or more frequency sub-bands of the first sound in one direction and modify, in the opposite direction, one or more frequency sub-bands of one or more other sounds that perceptually compete with the first sound. Sound modification application 122 may select any combination of the above modifications described above based on the specific sounds included in the one or more audio signals. For example, if a sound to be made more prominent has a very low amplitude compared to the other sounds, then sound modification application 122 may amplify the sound across the entire frequency band of the sound, amongst the modifications that may be performed.

In some embodiments, a first sound perceptually competes with a second sound if a perceived prominence of the second sound affects the perceived prominence of the first sound based on any number of criteria, including but not limited to sound amplitudes, characteristic frequency sub-bands, and so on. In some embodiments, sound modification application 122 may analyze the sounds in the one or more audio signals and identify perceptually competing sounds in any technically feasible manner, including but not limited to machine learning-based techniques and lookup in a database (e.g., sounds database 124).

After a sub-band is selected for male voice sound 206, the sound modification application 122 modifies the sub-band in the male voice sound 206, for example, using a parametric equalization technique as described above. The modification to the male voice sound 206 may be in the opposite direction of the modification to the traffic sound 204 and, in some embodiments, by approximately the same amount. Accordingly, in FIG. 2C, the amplitude of the sub-band portion 218 of the male voice sound 206 is decreased to the modified portion 220.

Figure 2D:
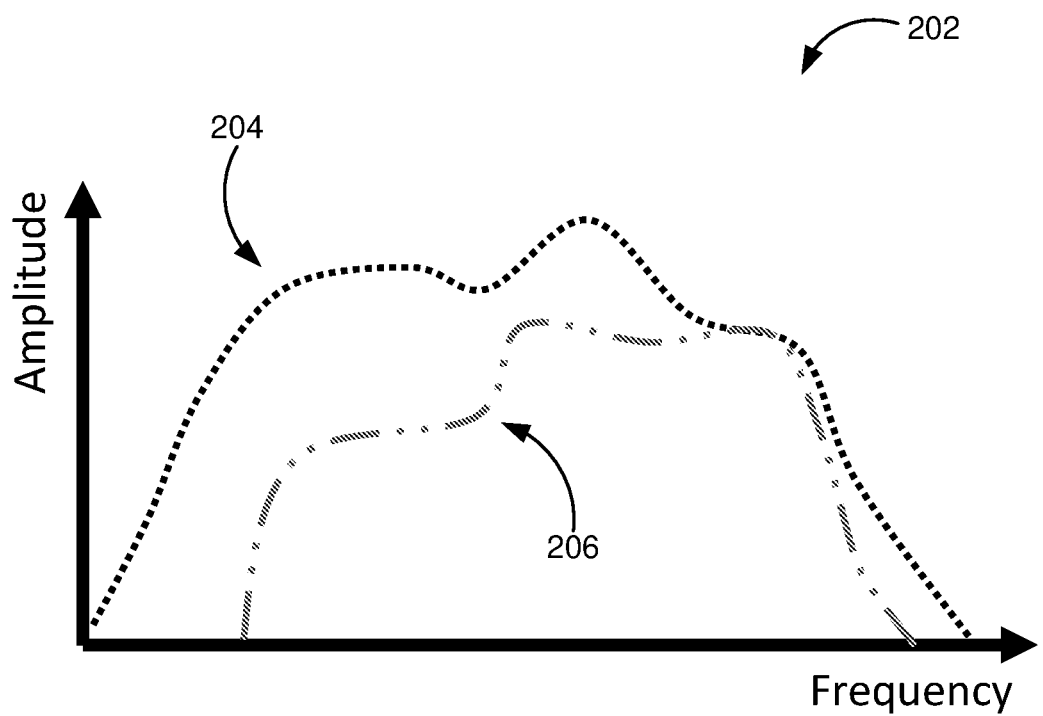
FIG. 2D illustrates a graphical representation of sounds in the audio signal after the modifications illustrated in FIG. 2C, according to one or more aspects of the various embodiments.

FIG. 2D illustrates a graphical representation of sounds included in the audio signal after the modifications illustrated in FIG. 2C, according to one or more aspects of the various embodiments. The graphical representation 202 in FIG. 2D shows the modified traffic sound 204 and the modified male voice sound 206. As compared to the sounds shown in FIGS. 2A and 2B, the traffic sound 204 and male voice sound 206 shown in FIG. 2D have different peaks and valleys, due to the modifications applied via the techniques described above. Further, as compared to the sounds shown in FIG. 2A, the overall energy level of the sounds are not changed significantly. After completing the modifications, the sound modification application 122 may generate a modified audio signal that includes the modified sounds 204 and 206. The sound modification application 122 may further cause the modified audio signal to be output to the user via audio output device(s) 156. For example, the sound modification application 122 transmits the modified audio signal to the audio output devices 156.

Figure 3:
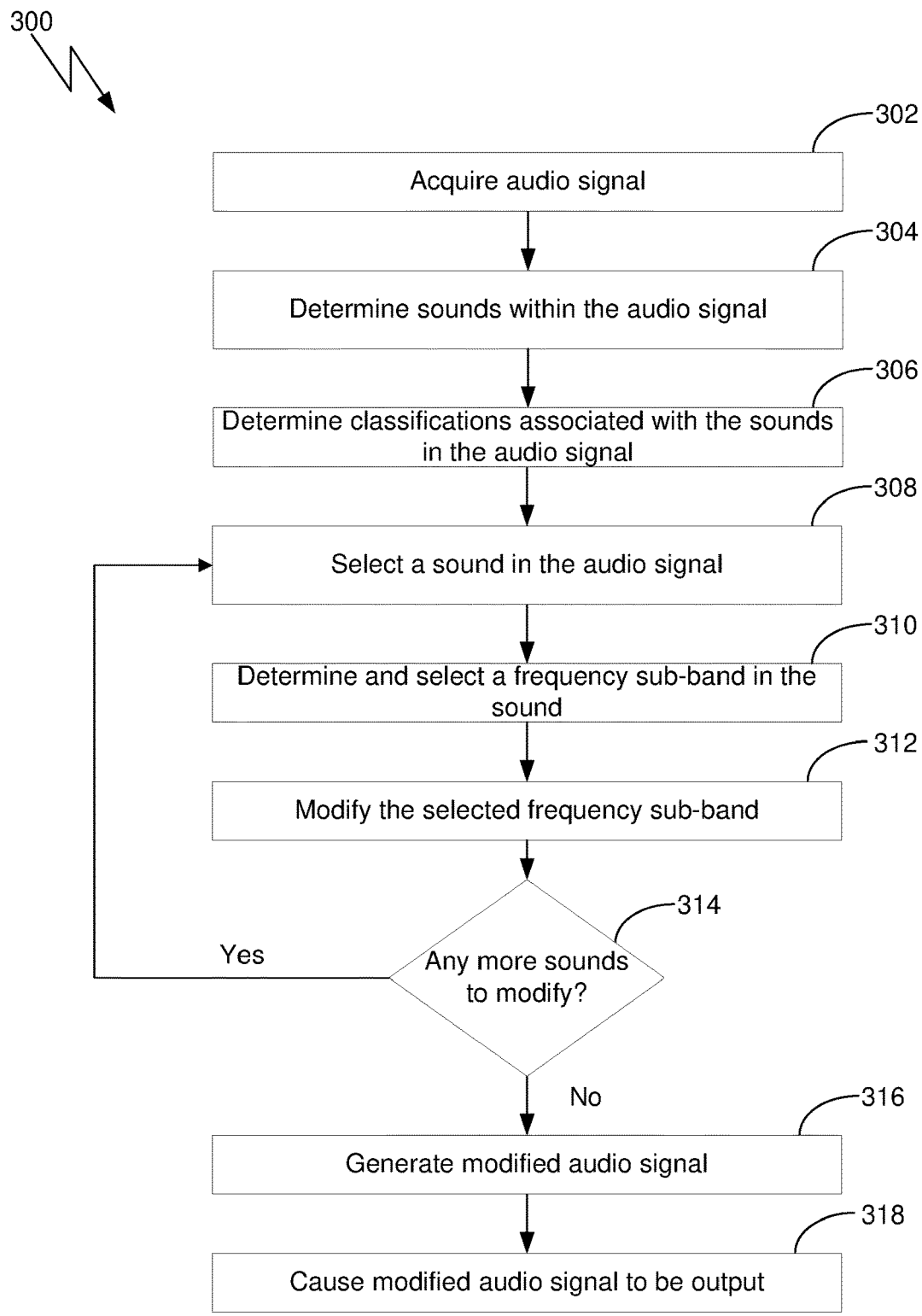
FIG. 3 illustrates a flowchart of method steps for selectively modifying a sound in one or more audio signals, according to one or more aspects of the various embodiments.

FIG. 3 illustrates a flowchart of method steps for selectively modifying a sound in one or more audio signals, according to one or more aspects of the various embodiments. Although the method steps are described in conjunction with the systems of FIGS. 1-2A-2D, persons skilled in the art will understand that any system configured to perform the methods, in any order, falls within the scope of the various embodiments.

As shown in FIG. 3, a method 300 begins at step 302, where a sound modification application 122 acquires one or more audio signals. The audio signal(s) may be acquired via audio input device(s) 154 (e.g., a microphone capturing sounds from the environment). At step 304, the sound modification application 122 determines a plurality of sounds within the one or more audio signals (e.g., multiple sounds in an audio signal, a sound in each of one or more audio signals). The sound modification application 122 may determine the sounds using any technically feasible technique (e.g., machine learning, sound object detection, sound spatialization, sound segmentation or decomposition, etc.).

At step 306, the sound modification application 122 determines classifications for the sounds included in the one or more audio signals. For each sound that was determined in step 304, the sound modification application 122 determines one or more classifications (e.g., whether the sound is of a person or animal or object, a specific type of person or animal or object, etc.) associated with the sound. The one or more classifications associated with the sound may indicate the source (or type of source) that produced the sound. The sound modification application 122 may determine the classifications using any technically feasible technique, which may include one or more of the same techniques as those used for determining the sounds in step 304.

At step 308, the sound modification application 122 selects a sound in the one or more audio signals. The sound modification application 122 may select a sound based on user input. In various embodiments, the sound modification application 122 may present an interface to the user (e.g., by displaying a graphical user interface in an application via display device 158). The user may manipulate elements in the user interface (e.g., slider controls, such as slider controls 208 and 210, corresponding to the sound) to select a sound for modification. The sound modification application 122 may select the sound that the user selected via the user interface (e.g., based on the slider controls that are manipulated by the user) for modification. In some embodiments, the sound modification application 122 may be configured by the user with rules specifying sounds to automatically modify upward or downward based on one or more specified classifications. The sound modification application 122 may automatically select a sound in accordance with those rules.

At step 310, the sound modification application 122 determines and selects a frequency sub-band in the sound selected in step 308. The sound modification application 122 determines the characteristic frequency sub-bands in the sound and selects one or more of those sub-bands. The characteristic sub-bands may be determined based on information related to the classification(s) associated with the sound, obtained from the sound database 124, and/or based on an analysis (e.g., sound spectrogram analysis) of the sound in the audio signal.

At step 312, the sound modification application 122 modifies the frequency sub-band(s) selected in step 310. For example, as shown in FIG. 2C, the amplitude of portion 216 of the sound 204 is increased in accordance with user manipulation of the slider control 208. The sound modification application may modify the sub-band using any technically feasible technique (e.g., parametric equalization, graphic equalization).

At step 314, the sound modification application 122 determines whether there are additional sounds in the one or more audio signals to modify (e.g., based on user selection via the user interface, by automatically modifying other sounds in order to make modifications to modified sounds more prominent, by automatically modifying other sounds based on rules). If there are additional sounds to be modified, then the method proceeds to step 308 and selects another sound in the one or more audio signals to be modified. If there are no additional sounds to be modified, then the method proceeds to step 316.

At step 316, the sound modification application 122 generates one or more audio signals that includes the sounds modified in step 312 (the "modified audio signal(s)"). At step 318, the sound modification application 122 causes the modified audio signal(s) to be output as sound waves to a user (e.g., via audio output devices 156). For example, the sound modification application 122 may transmit the modified audio signal(s) to one or more audio output devices 156. The sound modification application 122 may further cause one or more unmodified audio signal(s) (e.g., audio signals that included sounds not modified as described above) to be output via audio output devices 156 along with the modified audio signal(s).

In some embodiments, one or more of the operations and techniques described above may be performed at a cloud computing system 170 in conjunction with the computing device 102. For example, the computing device 102 may transmit the audio signal acquired via audio input devices 154 for processing by the cloud computing system 170. In such embodiments, the processing at the cloud computing system 170 may include one or more of the operations performed by the sound modification application 122 described above (e.g., one or more of determining the sounds in the audio signal, determining the classifications associated with the sounds, and determining and selecting a frequency sub-band). The cloud computing system 170 may include one or more applications or modules that perform one or more of the operations which are the same as or similar to the operations performed by sound modification application 122, as described above. Further, in some embodiments, the cloud computing system 170 may include historical and/or trained data (e.g., trained sound detection neural networks, etc.) that may be applied to assist in the operation described above, and the cloud computing system 170 may further add to the historical and/or trained data based on the data received from the computing device 102.

In some embodiments, the operations and techniques described above are performed in real time or near real time, so that the time delay between the capture of the sounds via the audio input devices 154 and output of modifications of the sounds via the audio output devices 156 may be minimized. That is, the modified audio signal may be output in real time or near real time. Accordingly, in some embodiments, the operations and techniques described above may be performed entirely locally at the computing device 102. Alternatively, the operations and techniques performed at the computing device 102 may be performed in conjunction with the cloud computing system 170 (e.g., querying a sounds database 124 located at the cloud computing system 170 to determine and select a frequency sub-band, having the cloud computing system 170 determine the sounds and classifications in the audio signal, etc.).

In sum, a sound modification system determines a plurality of sounds included in one or more audio signals and determines, for each sound included in the plurality of sounds, one or more classifications associated with the sound. In some embodiments, the classifications may include one or more of a type of person (e.g., male, female), a user identity (e.g., identities of specific persons), a type of animal (e.g., cat, dog, bird), and a type of object (e.g., car, traffic, construction equipment, airplane). The sound modification system selects a first sound included in the plurality of sounds for modification. The sound modification system then determines a first frequency sub-band of the first sound based at least on a classification of the first sound and modifies the first frequency sub-band. In some embodiments, the sound modification system modifies the first frequency sub-band by increasing or decreasing an amplitude of the first frequency sub-band of the first sound. The sound modification system may further select a second sound, determine a second frequency sub-band of the second sound, and modify the second frequency sub-band of the second sound.

At least one advantage and technological improvement of the disclosed techniques is that one or more sounds included in one or more audio signals can be modified without significantly altering the overall energy level of the one or more audio signals. For example, the perceived loudness and/or the timbre of the sounds in the modified audio signal may be substantially the same as prior to the modification. Modifying a sound in the audio signal would not unintentionally cause other sounds in the audio signal to be less perceivable to the user. Accordingly, the modified audio signal may sound more natural and properly balanced to a user, as compared to an audio signal that is modified using conventional approaches.

1. In some embodiments, a computer-implemented method for modifying a sound included in an audio signal comprises determining, for each sound included in a plurality of sounds included in at least one audio signal, one or more classifications associated with the sound; selecting a first frequency sub-band of a first sound included in the plurality of sounds based on a first classification associated with the first sound; and modifying the first frequency sub-band of the first sound, without modifying at least a second frequency sub-band of the first sound, to generate a modified audio signal.

2. The method of clause 1, further comprising selecting a third frequency sub-band of a second sound included in the plurality of sounds based on at least one of a second classification associated with the second sound, an analysis of the second sound, a frequency range of the first frequency sub-band, and a center frequency of the first frequency sub-band; and modifying the third frequency sub-band of the second sound, without modifying at least a fourth frequency sub-band of the second sound.

3. The method of clauses 1 or 2, wherein modifying the first frequency sub-band of the first sound comprises performing parametric equalization on the first frequency sub-band.

4. The method of any of clauses 1-3, further comprising receiving a user input, wherein the modifying is performed based on the user input.

5. The method of any of clauses 1-4, further comprising displaying a user interface, the user interface comprising a control object for each sound included in the plurality of sounds, wherein the user input is received via a control object corresponding to the first sound.

6. The method of any of clauses 1-5, wherein selecting the first frequency sub-band of the first sound comprises obtaining, from a database, characteristic frequency information associated with the one or more classifications associated with the first sound; and selecting the first frequency sub-band based on the information.

7. The method of any of clauses 1-6, wherein the modifying is performed in response to a determination that the first sound perceptually competes with a second sound included in the plurality of sounds.

8. The method of any of clauses 1-7, further comprising generating at least a second audio signal that includes the modified audio signal, wherein the at least a second audio signal includes the plurality of sounds, and wherein the first frequency sub-band of the first sound included in the at least a second audio signal is modified, and the second frequency sub-band of the first sound included in the at least a second audio signal is unmodified.

9. In some embodiments, one or more non-transitory computer readable storage media stores instructions, that, when executed by at least one processor, cause the at least one processor to perform the steps of determining, for each sound included in a plurality of sounds included in at least one audio signal, one or more classifications associated with the sound; selecting a first frequency sub-band of a first sound included in the plurality of sounds based on a first classification associated with the first sound; modifying the first frequency sub-band of the first sound, without modifying at least a second frequency sub-band of the first sound; selecting a third frequency sub-band of a second sound included in the plurality of sounds; and modifying the third frequency sub-band of the second sound, without modifying at least a fourth frequency sub-band of the second sound, to generate a modified audio signal.

10. The one or more computer-readable storage media of clause 9, wherein modifying the first frequency sub-band of the first sound comprises performing parametric equalization on the first frequency sub-band.

11. The one or more computer-readable storage media of clauses 9 or 10, further comprising receiving a user input, wherein modifying the first frequency sub-band of the first sound comprises increasing or decreasing an amplitude of the first frequency sub-band based on the user input.

12. The one or more computer-readable storage media of any of clauses 9-11, further comprising displaying a user interface, the user interface comprising a control object for each sound included in the plurality of sounds.

13. The one or more computer-readable storage media of any of clauses 9-12, wherein selecting the third frequency sub-band of the second sound comprises selecting the third frequency sub-band based on at least one of a second classification associated with the second sound, an analysis of the second sound, a frequency range of the first frequency sub-band, and a center frequency of the first frequency sub-band.

14. The one or more computer-readable storage media of any of clauses 9-13, wherein selecting the first frequency sub-band of the first sound comprises obtaining, from a database, characteristic frequency information associated with the one or more classifications associated with the first sound; and selecting the first frequency sub-band based on the information.

15. The one or more computer-readable storage media of any of clauses 9-14, further comprising generating at least a second audio signal that includes the modified audio signal, wherein the at least a second audio signal includes the plurality of sounds, the first frequency sub-band of the first sound included in the at least a second audio signal is modified, and the second frequency sub-band of the first sound included in the at least a second audio signal is unmodified, and wherein the third frequency sub-band of the second sound included in the at least a second audio signal is modified, and the fourth frequency sub-band of the second sound included in the at least a second audio signal is unmodified.

16. A system comprises a memory; and at least one processor coupled to the memory and configured to detect a plurality of sounds included in at least one audio signal; determine, for each sound included in the plurality of sounds, one or more classifications associated with the sound; select a first frequency sub-band of a first sound included in the plurality of sounds based on a first classification associated with the first sound; and modify the first frequency sub-band of the first sound, without modifying at least a second frequency sub-band of the first sound, to generate a modified audio signal.

17. The system of clause 16, wherein the at least one processor is further configured to select a third frequency sub-band of a second sound included in the plurality of sounds based on at least one of a second classification associated with the second sound, an analysis of the second sound, a frequency range of the first frequency sub-band, and a center frequency of the first frequency sub-band; and modify the third frequency sub-band of the second sound, without modifying at least a fourth frequency sub-band of the second sound.

18. The system of clauses 16 or 17, wherein the first classification is one of a human voice, an animal sound, or an object sound.

19. The system of any of clauses 16-18, further comprising a database, wherein the database comprises at least one mapping of the first classification to one or more characteristic frequency sub-bands, and wherein the one or more characteristic frequency sub-bands include the first frequency sub-band.

20. The system of any of clauses 16-19, wherein the at least one processor is further configured to generate at least a second audio signal that includes the modified audio signal, wherein the at least a second audio signal includes the plurality of sounds, and the first frequency sub-band of the first sound included in the at least a second audio signal is modified, and the second frequency sub-band of the first sound included in the at least a second audio signal is unmodified; and cause the at least a second audio signal to be output via an audio output device.

Any and all combinations of any of the claim elements recited in any of the claims and/or any elements described in this application, in any fashion, fall within the contemplated scope of the present embodiments and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for modifying a sound included in an audio signal, comprising:
   determining, for each sound included in a plurality of sounds included in at least one audio signal, one or more classifications associated with the sound;
   selecting a first frequency sub-band of a first sound included in the plurality of sounds based on a first classification associated with the first sound; and modifying the first frequency sub-band of the first sound, to generate a modified first frequency sub-band; and generating a second audio signal by combining the modified first frequency sub-band and an unmodified version of a second frequency sub-band of the first sound.

2. The method of claim 1, further comprising:
selecting a third frequency sub-band of a second sound included in the plurality of sounds based on at least one of a second classification associated with the second sound, an analysis of the second sound, a frequency range of the first frequency sub-band, and a center frequency of the first frequency sub-band; and
modifying the third frequency sub-band of the second sound, without modifying at least a fourth frequency sub-band of the second sound.

3. The method of claim 1, wherein modifying the first frequency sub-band of the first sound comprises performing parametric equalization on the first frequency sub-band.

4. The method of claim 1, further comprising receiving a user input, wherein the modifying is performed based on the user input.

5. The method of claim 4, further comprising displaying a user interface, the user interface comprising a control object for each sound included in the plurality of sounds, wherein the user input is received via a control object corresponding to the first sound.

6. The method of claim 1, wherein selecting the first frequency sub-band of the first sound comprises:
obtaining, from a database, characteristic frequency information associated with the one or more classifications associated with the first sound; and
selecting the first frequency sub-band based on the information.

7. The method of claim 1, wherein the modifying is performed in response to a determination that the first sound perceptually competes with a second sound included in the plurality of sounds.

8. One or more non-transitory computer readable storage media storing instructions, that, when executed by at least one processor, cause the at least one processor to perform the steps of:
determining, for each sound included in a plurality of sounds included in at least one audio signal, one or more classifications associated with the sound;
selecting a first frequency sub-band of a first sound included in the plurality of sounds based on a first classification associated with the first sound;
modifying the first frequency sub-band of the first sound to generate a first modified frequency sub-band;
selecting a second frequency sub-band of a second sound included in the plurality of sounds;
modifying the second frequency sub-band of the second sound to generate a second modified frequency sub-band; and
generating at least a second audio signal by combining the first modified frequency sub-band and a first unmodified version of a third frequency sub-band of the first sound and by combining the second modified frequency sub-band and a second unmodified version of a fourth frequency sub-band of the second sound.

9. The one or more computer-readable storage media of claim 8, wherein modifying the first frequency sub-band of the first sound comprises performing parametric equalization on the first frequency sub-band.

10. The one or more computer-readable storage media of claim 8, further comprising receiving a user input, wherein modifying the first frequency sub-band of the first sound comprises increasing or decreasing an amplitude of the first frequency sub- band based on the user input.

11. The one or more computer-readable storage media of claim 8, further comprising displaying a user interface, the user interface comprising a control object for each sound included in the plurality of sounds.

12. The one or more computer-readable storage media of claim 8, wherein selecting the second frequency sub-band of the second sound comprises selecting the second frequency sub-band based on at least one of a second classification associated with the second sound, an analysis of the second sound, a frequency range of the first frequency sub-band, and a center frequency of the first frequency sub-band.

13. The one or more computer-readable storage media of claim 8, wherein selecting the first frequency sub-band of the first sound comprises:
obtaining, from a database, characteristic frequency information associated with the one or more classifications associated with the first sound; and
selecting the first frequency sub-band based on the information.

14. A system, comprising:
a memory; and
at least one processor coupled to the memory and configured to:
detect a plurality of sounds included in at least one audio signal;
determine, for each sound included in the plurality of sounds, one or more classifications associated with the sound;
select a first frequency sub-band of a first sound included in the plurality of sounds based on a first classification associated with the first sound; and
modify the first frequency sub-band of the first sound to generate a modified first frequency sub-band; and
generate a second audio signal by combining the modified first frequency sub-band and an unmodified version of a second frequency sub-band of the first sound.

15. The system of claim 14, wherein the at least one processor is further configured to:
select a third frequency sub-band of a second sound included in the plurality of sounds based on at least one of a second classification associated with the second sound, an analysis of the second sound, a frequency range of the first frequency sub-band, and a center frequency of the first frequency sub-band; and
modify the third frequency sub-band of the second sound, without modifying at least a fourth frequency sub-band of the second sound.

16. The system of claim 14, wherein the first classification is one of a human voice, an animal sound, or an object sound.

17. The system of claim 14, further comprising a database, wherein the database comprises at least one mapping of the first classification to one or more characteristic frequency sub-bands, and wherein the one or more characteristic frequency sub-bands include the first frequency sub-band.

* * * * *